(12) United States Patent
Ng et al.

(10) Patent No.: US 12,197,360 B2
(45) Date of Patent: Jan. 14, 2025

(54) AT-SPEED BURST SAMPLING FOR USER REGISTERS

(71) Applicant: Intel Corporation, Santa Clara, CA (US)

(72) Inventors: Bee Yee Ng, Bayan Lepas (MY); Gaik Ming Chan, Bayan Lepas (MY); Ilya K. Ganusov, San Jose, CA (US)

(73) Assignee: ALTERA CORPORATION, San Jose, CA (US)

( * ) Notice: Subject to any disclaimer, the term of this patent is extended or adjusted under 35 U.S.C. 154(b) by 692 days.

(21) Appl. No.: 17/359,027

(22) Filed: Jun. 25, 2021

(65) Prior Publication Data

US 2021/0326284 A1   Oct. 21, 2021

(51) Int. Cl.
*G06F 13/28*   (2006.01)

(52) U.S. Cl.
CPC .......... *G06F 13/28* (2013.01); *G06F 2213/16* (2013.01)

(58) Field of Classification Search
None
See application file for complete search history.

(56) References Cited

U.S. PATENT DOCUMENTS

2012/0207194 A1*   8/2012   Stang ............... H04B 15/02
                                                      375/219

* cited by examiner

*Primary Examiner* — Scott C Sun
(74) *Attorney, Agent, or Firm* — Fletcher Yoder, P.C.

(57) ABSTRACT

Systems and methods described herein may relate to burst sampling of an integrated circuit device. Such a system may include a first logic access block including a data register and a second logic access block including a memory column. The memory column may be configurable to operate as a First In, First Out (FIFO), user lookup table (LUT) mode, or as user random access memory (RAM). The memory column may store data sampled from the data register for any number of clock cycles and the data may be sampled at the speed of a clock of a device under test (DUT).

20 Claims, 7 Drawing Sheets

AT-SPEED BURST SAMPLING FOR USER REGISTERS

BACKGROUND

The present disclosure relates to integrated circuit (IC) devices such as programmable logic devices (PLDs). More particularly, the present disclosure relates to burst sampling for user registers of an integrated circuit system that is emulated on an integrated circuit device, such as a field programmable gate array (FPGA), application specific integrated circuit (ASIC), and so forth.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuit devices are found in a wide variety of products, including computers, handheld devices, industrial infrastructure, televisions, and vehicles. Many of these integrated circuit devices are application-specific integrated circuits (ASICs) that are designed and manufactured to perform specific tasks. A programmable logic device such as a field programmable gate array (FPGA), by contrast, may be configured after manufacturing with a variety of different system designs. Thus, ASIC designers often use a programmable logic device to test an ASIC design before the ASIC is manufactured. However, testing an ASIC design that is being emulated on a programmable logic device could be time-consuming and may involve emulating the ASIC design at a speed lower than its targeted real-time operation speed.

BRIEF DESCRIPTION OF THE DRAWINGS

Advantages of the present disclosure may become apparent upon reading the following detailed description and upon reference to the drawings in which.

DETAILED DESCRIPTION OF SPECIFIC EMBODIMENTS

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. The techniques presented and claimed herein are referenced and applied to material objects and concrete examples of a practical nature that demonstrably improve the present technical field and, as such, are not abstract, intangible or purely theoretical.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical exclusive-OR (XOR)). In other words, the phrase A "or" B is intended to mean A, B, or both A and B.

Programmable logic devices are increasingly permeating markets and are increasingly enabling customers to implement circuit designs in logic fabric (e.g., programmable logic). Programmable logic fabric of an integrated circuit device may be programmed to implement a programmable circuit design to perform a wide range of functions and operations. Due to the highly customizable nature of programmable logic devices, the logic fabric can be configured with a circuit design for an application specific integrated circuit (ASIC) prior to use or manufacture of the ASIC. The programmable logic fabric may include configurable blocks of programmable logic (e.g., sometimes referred to as logic array blocks (LABs) or configurable logic blocks (CLBs)) that have lookup tables (LUTs) that can be configured to operate as different logic elements based on the configuration data programmed into memory cells in the blocks.

A logic design implemented in a portion of programmable logic may generate an instruction to cause a reading or writing of data to another portion of programmable logic. These instructions may include a directly addressed read, a directly addressed write, a first-in, first-out (FIFO) read (e.g., streaming read), a FIFO write (e.g., streaming write), a load (e.g., plural write, batch write), and an unload (e.g., plural read, batch read). As programmable logic device applications have become ever more prevalent, there is a growing desire for efficient methods for debugging circuit designs. By quickly, continuously, and accurately capturing the circuit design states, debug operations may be improved by providing additional data generated by the functions at a faster rate.

As used herein, "ASIC emulation" refers to implementing at least a portion of an application-specific integrated circuit (ASIC) circuit design into another programmable logic device (e.g., an FPGA) in order to validate the functionality of the ASIC circuit design. As used herein, "burst sampling" refers to sampling data and capturing design states continuously for any number of clock cycles. Further, as used herein, "at speed" refers to sampling data and capturing design states at a clock speed of the programmable logic.

Figure 1:
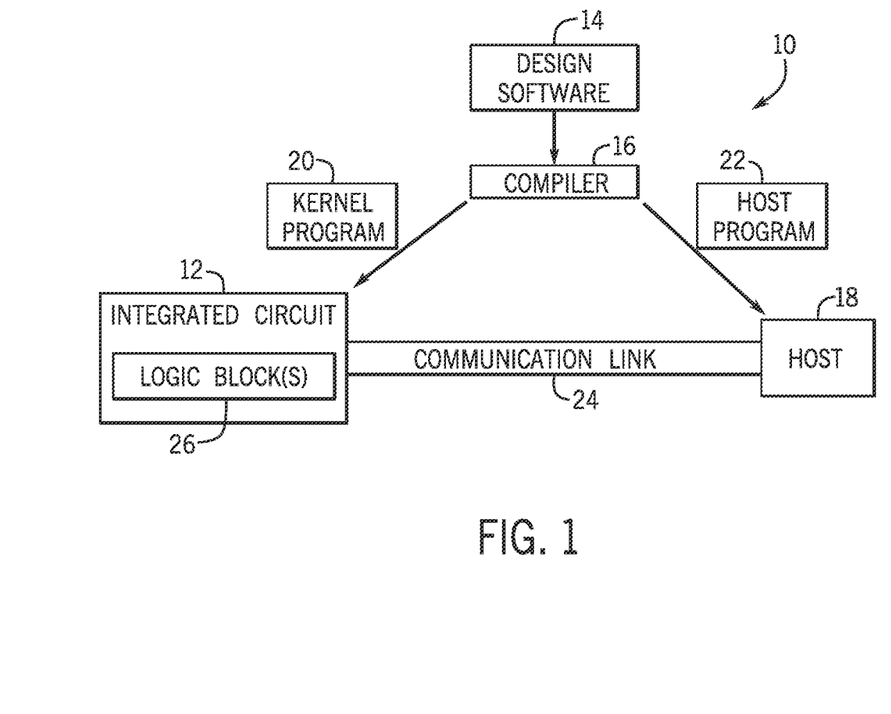
FIG. 1 is a block diagram of a system used to program an integrated circuit, in accordance with an embodiment.

With the foregoing in mind, FIG. 1 illustrates a block diagram of a system 10 that may implement arithmetic operations. A designer may desire to implement functionality, such as the arithmetic operations of this disclosure, on an integrated circuit 12 (e.g., a programmable logic device such as a field-programmable gate array (FPGA) or an application-specific integrated circuit (ASIC)). In some cases, the designer may specify a high-level program to be implemented, such as an OPENCL® program, which may enable the designer to more efficiently and easily provide programming instructions to configure a set of programmable logic cells for the integrated circuit 12 without specific knowledge of low-level hardware description languages (e.g., Verilog or VHDL). For example, since OPENCL® is quite similar to other high-level programming languages, such as C++, designers of programmable logic familiar with such programming languages may have a reduced learning curve than designers that are required to learn unfamiliar low-level hardware description languages to implement new functionalities in the integrated circuit 12.

The designer may implement high-level designs using design software 14, such as a version of INTEL® QUARTUS® by INTEL CORPORATION. The design software 14 may use a compiler 16 to convert the high-level program into a lower-level description. The compiler 16 may provide machine-readable instructions representative of the high-level program to a host 18 and the integrated circuit 12. The host 18 may receive a host program 22 which may be implemented by the kernel programs 20. To implement the host program 22, the host 18 may communicate instructions from the host program 22 to the integrated circuit 12 via a communications link 24, which may be, for example, direct memory access (DMA) communications or peripheral component interconnect express (PCIe) communications. In some embodiments, the kernel programs 20 and the host 18 may enable configuration of a logic block 26 on the integrated circuit 12. The logic block 26 may include circuitry and/or other logic elements and may be configured to implement arithmetic operations, such as addition and multiplication.

The designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
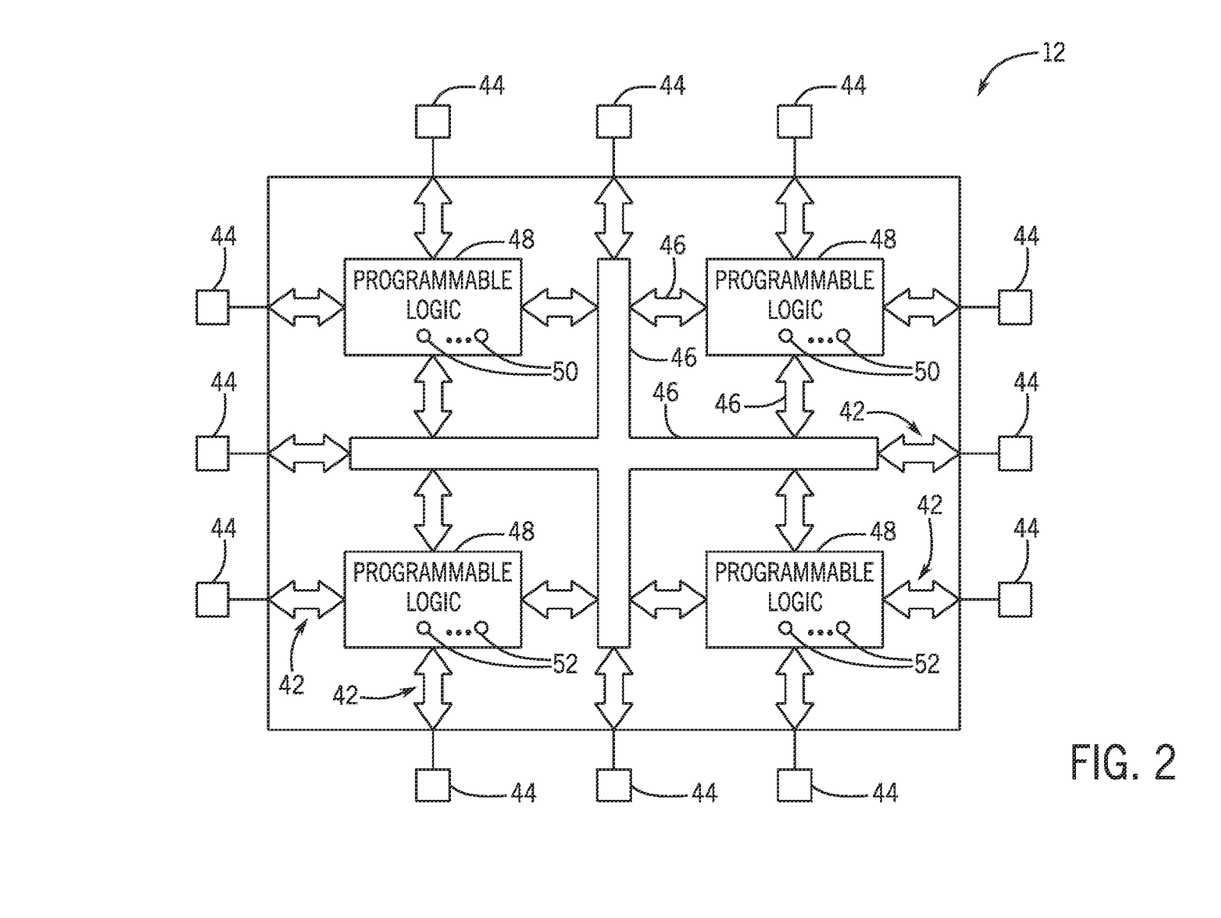
FIG. 2 is a block diagram of the integrated circuit of FIG. 1, in accordance with an embodiment.

Turning now to a more detailed discussion of the integrated circuit 12, FIG. 2 is a block diagram of an example of the integrated circuit 12 as a programmable logic device, such as a field-programmable gate array (FPGA). Further, it should be understood that the integrated circuit 12 may be any other suitable type of programmable logic device (e.g., an ASIC and/or application-specific standard product). The integrated circuit 12 may have input/output circuitry 42 for driving signals off device and for receiving signals from other devices via input/output pins 44. Interconnection resources 46, such as global and local vertical and horizontal conductive lines and buses, and/or configuration resources (e.g., hardwired couplings, logical couplings not implemented by user logic), may be used to route signals on integrated circuit 12. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as the integrated circuit 12, may include programmable elements, such as configuration random-access-memory (CRAM) cells 50 loaded with configuration data during programming and look-up table random-access-memory (LUTRAM) cells 52 that may store either configuration data or user data, with the programmable logic 48. For example, as discussed above, a designer (e.g., a customer) may (re)program (e.g., (re)configure) the programmable logic 48 to perform one or more desired functions. By way of example, some programmable logic devices may be programmed or reprogrammed by configuring programmable elements using mask programming arrangements, which is performed during semiconductor manufacturing. Other programmable logic devices are configured after semiconductor fabrication operations have been completed, such as by using electrical programming or laser programming to program programmable elements. In general, programmable elements may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements may be formed from one or more memory cells. For example, during programming, configuration data is loaded into the memory cells using input/output pins 44 and input/output circuitry 42. In one embodiment, the memory cells may be implemented as random-access-memory (RAM) cells. The use of memory cells based on RAM technology is described herein is intended to be only one example. These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Keeping the discussion of FIG. 1 and FIG. 2 in mind, a user (e.g., designer) may utilize the design software 14 to implement the logic block 26 on the programmable logic 48 of the integrated circuit 12. In particular, the designer may specify in a high-level program that mathematical operations such as addition and multiplication be performed. The compiler 16 may convert the high-level program into a lower-level description that is used to program the programmable logic 48 to perform addition.

Figure 3:
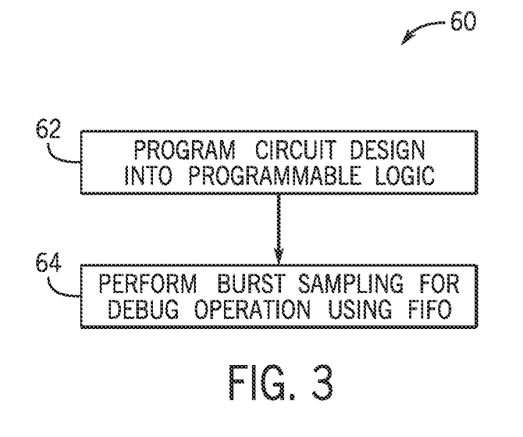
FIG. 3 is a process diagram for a burst sampling technique for a debug operation using a FIFO, in accordance with an embodiment.

Once programmed, the operations of the integrated circuit 12 and the circuit design may be debugged by sampling and analyzing data from the operations. The integrated circuit 12 may be an FPGA implemented at least a portion of an ASIC design. In order to provide accurate debugging, design states (e.g., data generated by the integrated circuit 12) may be captured continuously for several clock cycles (e.g., burst sampling) and at a speed of a clock of the programmable logic (e.g., at speed). FIG. 3 is a flow diagram of a process for performing burst sampling for debug operation of the integrated circuit 12. While the process 60 is described using steps in a specific sequence, it should be understood that the present disclosure contemplates that the described steps may be performed in different sequences than the sequence illustrated, and certain described steps may be implemented by executing instructions stored in a tangible, non-transitory, computer-readable medium using any suitable processing circuitry.

In the process 60, a host may receive a circuit design and a compiler may compile the circuit design to be implemented as a circuit on an integrated circuit device, such as an FPGA. The host may program (block 62) the circuit design into programmable logic 48 of the integrated circuit 12. Once programmed, the operations may be burst sampled for debug and error correction. In the process 60, a FIFO may perform burst sampling (block 64) of data generated during operation of the circuit based on the circuit design. For example, the circuit design may include instrumentation logic that may monitor and/or collect signal data when the circuit is implemented by a programmable logic device, such as the integrated circuit 12. The host may receive and/or may retrieve the generated signal data for debug operations and analysis.

When testing a circuit design, such as when emulating an integrated circuit (e.g., an ASIC) on a programmable logic device, burst sampling of data registers may allow for debug operations that take place at an expected speed of operation of the integrated circuit. In some cases, burst sampling may allow for testing that takes place in real time or near real time. This allows for a more realistic test of the emulated integrated circuit. Indeed, the emulated integrated circuit may be debugged without slowing down the emulation to a slower speed than the expected operation of the design of the integrated circuit (e.g., when the integrated circuit has been manufactured).

Figure 4:
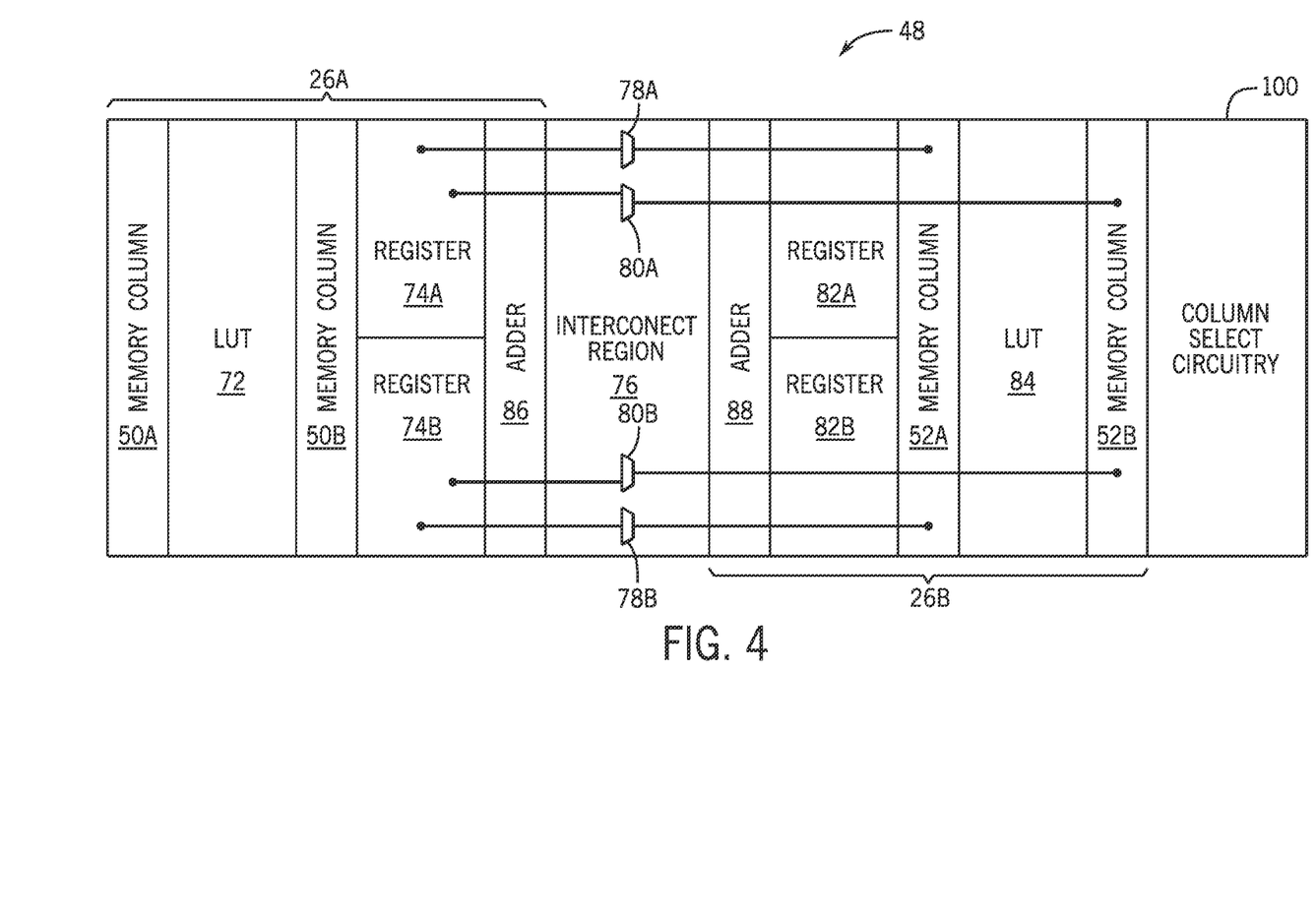
FIG. 4 is a block diagram of programmable logic of the integrated circuit of FIG. 1, in accordance with an embodiment.

To provide for burst sampling of data registers, FIG. 4 is a block diagram of example programmable logic 48. The programmable logic 48 may include a first logic block 26A and a second logic block 26B. In certain embodiments, the logic blocks 26A, 26B may be placed adjacent to each other in the programmable logic 48. The first logic block 26A may include any number of memory columns 50A, 50B. The memory columns 50A, 50B may include CRAM cells loaded with configuration data during programming. In certain embodiments, each memory column 50A, column 50B may include thirty-two CRAM cells and the memory columns 50A, 50B may be read only. The first logic block 26A may also include lookup table(s) (LUT) 72 and data registers 74A, 74B. The lookup table 72 may include any number of multiplexers and the memory columns 50A, 50B may encode a function(s) of the lookup table 72. The data registers 74A, 74B may be a storage unit and may store a single bit of data during each clock cycle of the circuit design under test.

The second logic block 26B may include any number of memory columns 52A, 52B. The memory columns 52A, 52B may include LUTRAM cells that may store configuration data or user data. For example, the memory columns 52A, 52B may be operated in a first mode to store configuration data or a second mode (e.g., FIFO) to store user data sampled from the data registers 74A, 74B. Each of the memory columns 52A, 52B may include thirty-two LUTRAM cells and each LUTRAM cell may store data from a corresponding register for a single clock cycle. Accordingly, each memory column 52A, 52B may store thirty-two continuous clock cycles of data from a corresponding data register 74A, 74B. In some embodiments, the memory column 52A may be operated to store data sampled from the data register 74A and/or data sampled from the data register 74B for the same sixteen continuous clock cycles. Alternatively, the memory column 52A may be operated to store data sampled from the data register 74A or 74B for thirty-two continuous clock cycles. Additionally or alternatively, the memory column 52B may be operated to store data sampled from the data register 74A and/or data sampled from the data register 74B for the same sixteen continuous clock cycles. In some cases, the memory columns 52A, 52B may be operated to store data sampled from either the data register 74A or the data register 74B for sixty-four continuous clock cycles.

In order to sample the data from the data registers 74A, 74B, an interconnect region 76 may be disposed between the first logic block 26A and the second logic block 26B. The interconnect region 76 may include any number of multiplexers, such as multiplexers 78A, 78B, 80A, 80B that provide a connection between the data registers 74A, 74B and a corresponding one of the memory columns 52A, 52B. The multiplexers 78A, 78B may provide a hardwire connection between the corresponding data registers 74A, 74B and the memory column 52A of the second logic block 26B. Likewise, multiplexers 80A, 80B may provide a hardwire connection between the corresponding data registers 74A, 74B and the memory column 52B of the second logic block 26B.

The second logic block 26B may also include data registers 82A, 82B and lookup table 84. The data registers 82A, 82B may be a storage unit and may store a single bit of data. The first logic block 26A and the second logic block 26B may also include adders 86, 88, respectively. The adders 86, 88 may perform arithmetic operations on the corresponding logic block 26A, 26B.

Figure 5:
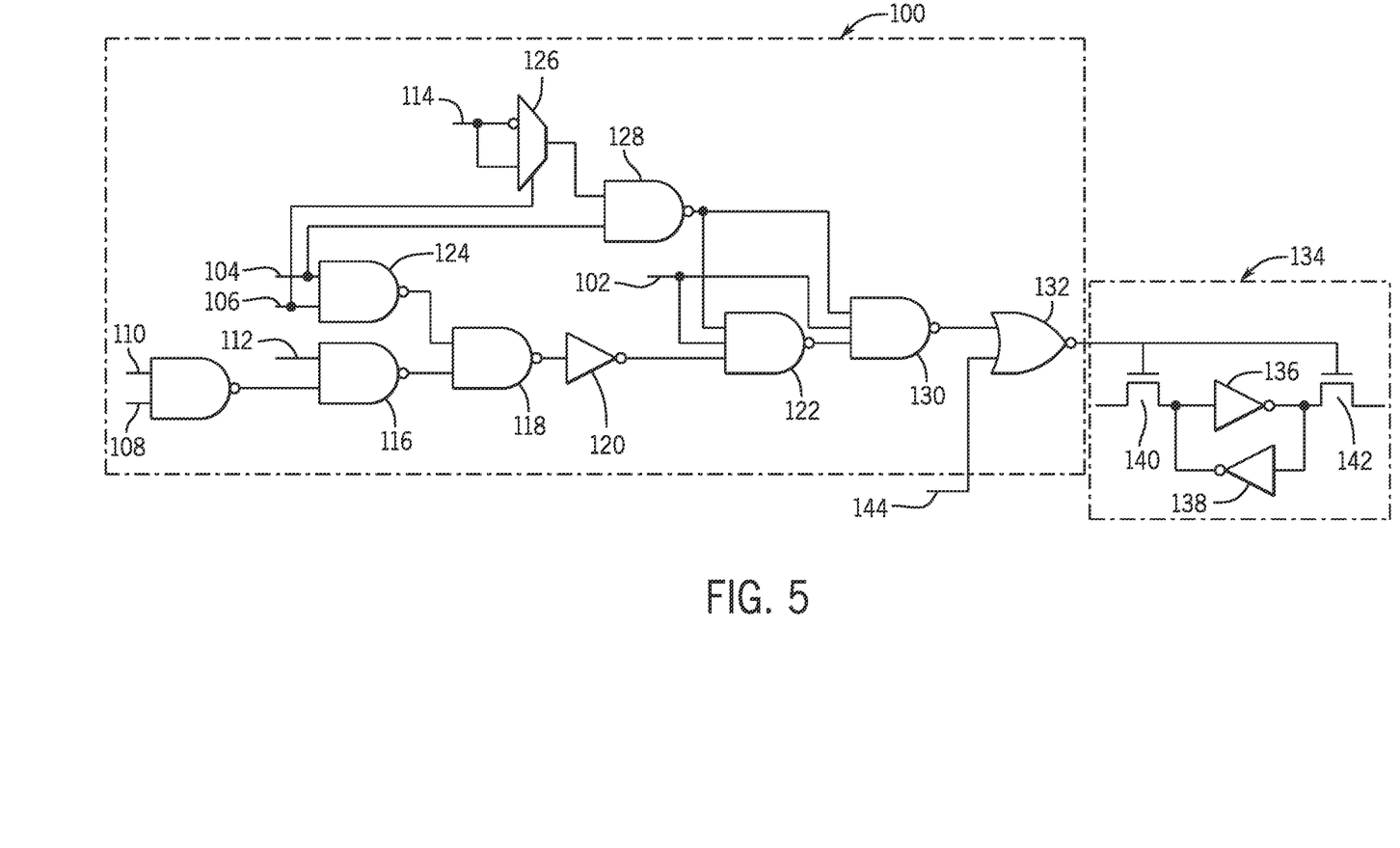
FIG. 5 is a schematic diagram of column select circuitry, in accordance with an embodiment.

In order to read data from or write data to a particular memory cell, each memory cell may be referenced with a column address and a row address. Column select circuitry may select a row address and a column address for reading or writing data to the particular memory cell. With the foregoing in mind, FIG. 5 illustrates a schematic diagram for column select circuitry 100 and a LUTRAM memory cell 134 for control of operational modes of a burst sampling FIFO. The column select circuitry 100 may operate according to Table 1 and the following description. A column select off signal 102 may control power to the column select circuitry 100 and may turn off the column select circuitry 100 when the burst sampling FIFO is not being used. The FIFO emulation signal 104 may control operation of the memory columns 52A, 52B to be used as FIFO for burst sampling of the data registers 74A, 74B. The FIFO sixteen signal 106 may control operation of the memory columns 52A and/or 52B to use sixteen memory cells for burst sampling of the data registers 74A and/or 74B. The FIFO sixty four signal 108 may control operation of the memory columns 52A and 52B to use thirty-two memory cells each for burst sampling of the data registers 74A and/or 74B. The bit address signals 110, 112 may specify a write address bit for the column select circuitry 100. The burst sampling write enable signal 114 may control a write operation to burst sampling data from the data registers 74A and/or 74B. The column select circuitry 100 may include any number of logic gates, such as logic gates 116, 118, 120, 122, 124, 126, 128, 130, 132 and the LUTRAM memory cell 134 may include logic gates 136, 138 and transistors 140, 142 to control operation of the memory columns 52A and/or 52B. A column select signal 144 may provide a column address for writing data to the memory cells of the memory columns 52A, 52B.

TABLE 1

| Column Select Off Signal 102 | FIFO Emulation Signal 104 | FIFO Sixteen signal 106 | FIFO Sixty Four Signal 108 | Burst Sampling Write Enable Signal 114 | FIFO Mode |
|---|---|---|---|---|---|
| 0 | X | X | X | X | Configuration Data Mode |
| 1 | 0 | X | 0 | X | User RAM |

TABLE 1-continued

| Column Select Off Signal 102 | FIFO Emulation Signal 104 | FIFO Sixteen signal 106 | FIFO Sixty Four Signal 108 | Burst Sampling Write Enable Signal 114 | FIFO Mode |
|---|---|---|---|---|---|
| 1 | 0 | X | 1 | X | Thirty Two Memory Cells User RAM Sixty Four Memory Cells |
| 1 | 1 | 0 | 0 | 0 | FIFO Disable |
| 1 | 1 | 0 | 0 | 1 | FIFO Thirty Two Memory cells |
| 1 | 1 | 0 | 1 | 0 | FIFO Disable |
| 1 | 1 | 0 | 1 | 1 | FIFO Sixty Four Memory Cells |
| 1 | 1 | 1 | X | 0 | FIFO Disable |
| 1 | 1 | 1 | X | 1 | FIFO Sixteen Memory Cells |

Figure 6:
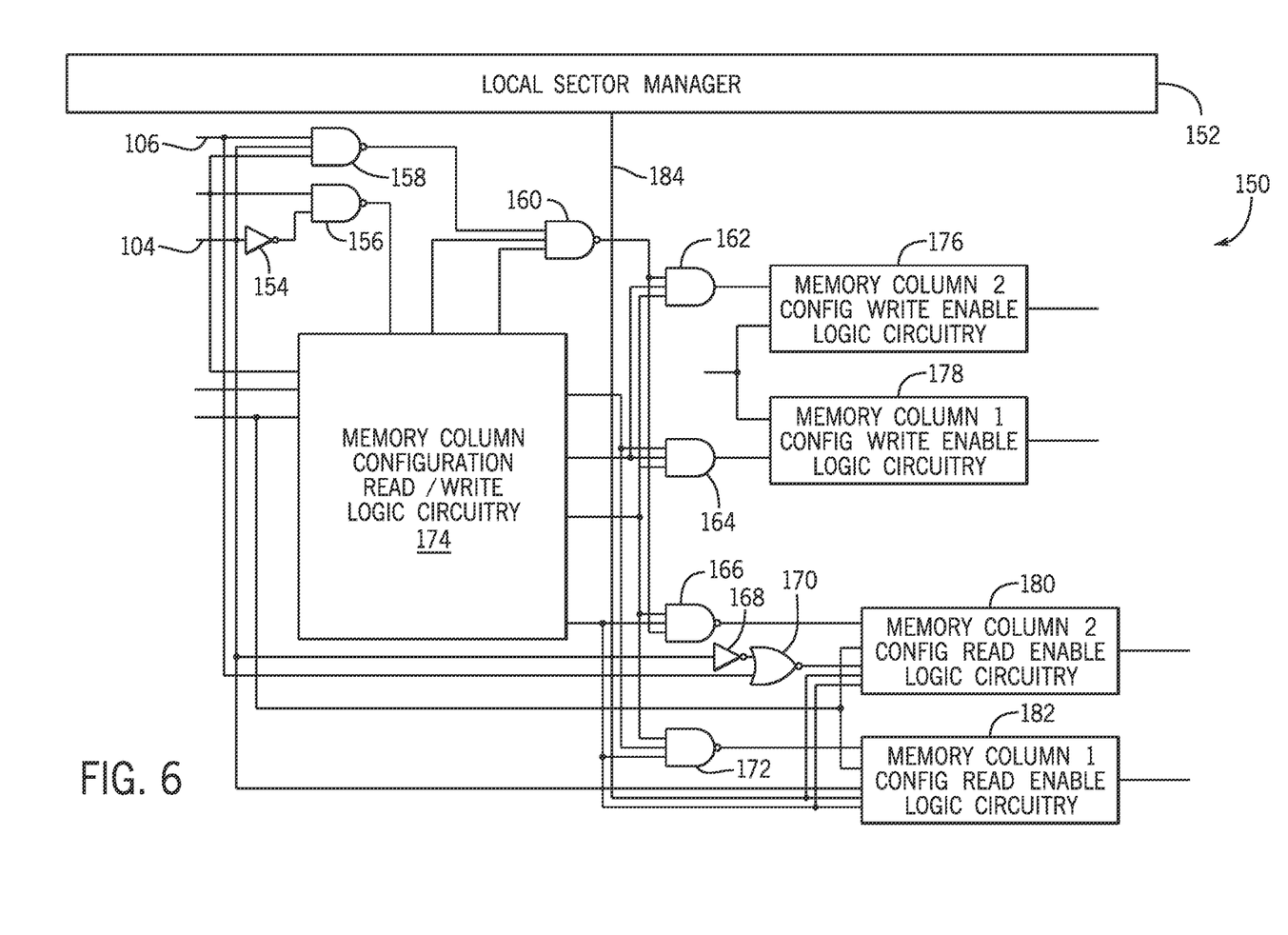
FIG. 6 is a schematic diagram of configuration read/write circuitry for the programmable logic of FIG. 4, in accordance with an embodiment.

FIG. 6 illustrates a schematic diagram for configuration read/write circuitry 150 including a local sector manager (LSM) 152 that may execute instructions to control operation of a FIFO during burst sampling. The configuration read/write circuitry 150 and the local sector manager 152 may operate according to Table 2. The local sector manager 152 may execute instructions and provide signals that are processed by logic gates 154, 156, 158, 160, 162, 164, 166, 168, 170, 172, and logic circuitries 174, 176, 178, 180, 182 may receive the instructions and assist in controlling operation of a FIFO during burst sampling. The read enable signal 184 may control a read operation for burst sampling data from the data registers 74A and/or 74B. For example, during a burst sampling FIFO write operation, the FIFO emulation signal 104 may be high (e.g., 1) and the FIFO sixteen signal 106 may also be high (e.g., 1). As such, the memory column 52A may perform sixteen continuous clock cycles of burst sampling and the memory column 52B may be configured to other user functions (e.g., LUT mode or user RAM mode). Registers 74A and/or 74B may write to memory column 52A for sixteen continuous clock cycles. When the FIFO sixteen signal 106 is low (e.g., 0), the memory column 52A and memory column 52B may perform 32 continuous clock cycles of burst sampling. During a burst sampling FIFO read operation, the burst sampling read enable signal 184 may be high (e.g., 1) and the FIFO sixteen signal 106 may be high (e.g., 1). As such, data may be read-out from the memory column 52A. When the FIFO sixteen signal 106 is low (e.g., 0), data may be read out from both the memory column 52A and the memory column 52B.

TABLE 2

| | Burst Sampling Read FIFO Enable Signal 184 | FIFO Emulation Signal 104 | FIFO Sixteen Signal 106 | LUTRAM Mode Signal | Memory Column 52A | Memory Column 52B |
|---|---|---|---|---|---|---|
| Emulation Access Write (DUT) | 0 | 1 | 1 | 0 | Emulation FIFO 16 | RAM Mode |
| | 0 | 1 | 1 | 1 | Emulation FIFO 16 | LUT Mode |
| | 0 | 1 | 0 | 0 | Emulation FIFO 32 | Emulation FIFO 32 |
| | 0 | 1 | 0 | 1 | Emulation FIFO 32 | Emulation FIFO 32 |
| Emulation Access Read (DUT) | 1 | 1 | 1 | 0 | Emulation FIFO 16 | RAM Mode |
| | 1 | 1 | 1 | 1 | Emulation FIFO 16 | LUT Mode |
| | 1 | 1 | 0 | 0 | Emulation FIFO 32 | Emulation FIFO 32 |
| | 1 | 1 | 0 | 1 | Emulation FIFO 32 | Emulation FIFO 32 |
| Emulation Access Write (Non-DUT) | 0 | 0 | X | 0 | RAM Mode | RAM Mode |
| | 0 | 0 | X | 1 | LUT Mode | LUT Mode |
| Emulation Access Read (Non-DUT) | 1 | 0 | X | 0 | RAM Mode | RAM Mode |
| | 1 | 0 | X | 1 | LUT Mode | LUT Mode |

The integrated circuit device 12 may be a data processing system or a component included in a data processing system. For example, the integrated circuit device 12 may be a component of a data processing system 200 shown in FIG. 7. The data processing system 200 may include a host processor 202 (e.g., a central-processing unit (CPU)), memory and/or storage circuitry 204, and a network interface 206. The data processing system 200 may include more or fewer components (e.g., electronic display, user interface structures, application specific integrated circuits (ASICs)). The host processor 202 may include any suitable processor, such as an INTEL® Xeon® processor or a reduced-instruction processor (e.g., a reduced instruction set computer (RISC), an Advanced RISC Machine (ARM) processor) that may manage a data processing request for the data processing system 200 (e.g., to perform debugging, data analysis, encryption, decryption, machine learning, video processing, voice recognition, image recognition, data compression, database search ranking, bioinformatics, network security pattern identification, spatial navigation, or the like). The memory and/or storage circuitry 204 may include random access memory (RAM), read-only memory (ROM), one or more hard drives, flash memory, or the like. The memory and/or storage circuitry 204 may hold data to be processed by the data processing system 200. In some cases, the memory and/or storage circuitry 204 may also store configuration programs (bitstreams) for programming the integrated circuit device 12. The network interface 206 may allow the data processing system 200 to communicate with other electronic devices. The data processing system 200 may include several different packages or may be contained within a single package on a single package substrate.

Figure 7:
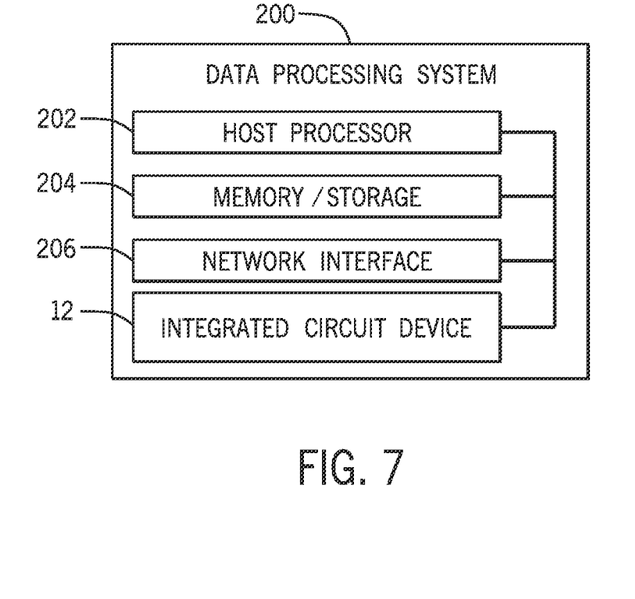
FIG. 7 is a data processing system, in accordance with an embodiment of the present disclosure.

In one example, the data processing system 200 may be part of a data center that processes a variety of different requests. For instance, the data processing system 200 may receive a data processing request via the network interface 206 to perform ASIC emulation, debugging, error detection, data analysis, encryption, decryption, machine learning, video processing, voice recognition, image recognition, data compression, database search ranking, bioinformatics, network security pattern identification, spatial navigation, digital signal processing, or some other specialized task.

While the embodiments set forth in the present disclosure may be susceptible to various modifications and alternative forms, specific embodiments have been shown by way of example in the drawings and have been described in detail herein. For example, any suitable combination of the embodiments and/or techniques described herein may be implemented. Accordingly, it should be understood that the disclosure is not intended to be limited to the particular forms disclosed. The disclosure is to cover all modifications, equivalents, and alternatives falling within the spirit and scope of the disclosure as defined by the following appended claims.

Technical effects of the present disclosure include system and methods that provide at speed burst sampling for a number of clock cycles of a device under test (DUT). The at-speed burst sampling techniques described herein may benefit operations of programmable logic devices, such as field programmable gate arrays and/or other configurable devices, by permitting sampling of data over numerous cycles for debugging circuit designs. The systems and methods described herein may enable a memory columns to operate as a FIFO for burst sampling of data registers.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . " it is intended that such elements are to be interpreted under 35 U.S.C. 112(f). However, for any claims containing elements designated in any other manner, it is intended that such elements are not to be interpreted under 35 U.S.C. 112(f).

Example Embodiments of the Disclosure

The following numbered clauses define certain example embodiments of the present disclosure.

Clause 1.
An integrated circuit, comprising:
a first logic block, the first logic block comprising a data register configurable to store data; and
a second logic block, the second logic block comprising a memory column coupled to the data register, wherein the memory column is configurable to operate as a First In, First Out (FIFO) to sample data from the data register for a plurality of clock cycles and at a speed of a clock of the integrated circuit.

Clause 2.
The integrated circuit of clause 1, comprising an interconnect region disposed between the first logic block and the second logic block.

Clause 3.
The integrated circuit of clause 2, wherein the interconnect region is configurable to couple the data register to the memory column.

Clause 4.
The integrated circuit of clause 2, wherein the interconnect region comprises a multiplexer configured to couple the data register to the memory column.

Clause 5.
The integrated circuit of clause 1, wherein the second logic block comprises a second memory column, wherein the second memory column is configurable to operate as a second FIFO to sample data from the data register for the plurality of clock cycles and at the speed of the clock.

Clause 6.
The integrated circuit of clause 1, wherein the first logic block comprises a second data register coupled to the memory column, wherein the memory column is configurable to operate as the FIFO to sample data from the data register and the second data register for the plurality of clock cycles.

Clause 7.
The integrated circuit of clause 1, comprising:
the first logic block comprising a second data register; and
the second logic block comprising a second memory column coupled to the second data register, wherein the second memory column is configurable to operate as a second FIFO to sample data from the second data register for the plurality of clock cycles.

Clause 8.
The integrated circuit of clause 7, wherein the second memory column is configurable to operate as user lookup table (LUT) mode or user random access memory (RAM) when not configured as the second FIFO.

Clause 9.
The integrated circuit of clause 1, wherein the memory column comprises at least thirty-two memory cells.

Clause 10.
The integrated circuit of clause 9, wherein the memory column is configurable to store data from the data register in at least sixteen memory cells.

Clause 11.
The integrated circuit of clause 10, wherein the data from the data register is from at least sixteen continuous clock cycles.

Clause 12.
The integrated circuit of clause 9, wherein the second logic block comprises a second memory column, wherein the second memory column comprises at least thirty-two memory cells.

Clause 13.
The integrated circuit of clause 12, wherein the memory column and the second memory column are configurable to store data from the data register from at least sixty-four continuous clock cycles.

Clause 14.
The integrated circuit of clause 9, wherein the memory column is configurable to store data from the data register from thirty-two continuous clock cycles.

Clause 15.
A system comprising:
programmable logic circuitry comprising a plurality of configuration memory, the programmable logic circuitry comprising:
a first logic block comprising a first data register and a second data register; and
a second logic block comprising a first memory column, wherein the first memory column is coupled to the first data register and the second data register, and wherein the first memory column is configurable to sample data from the first data register and the second data register for a plurality of clock cycles.

Clause 16.
The system of clause 15, wherein the programmable logic circuitry comprises:

a first multiplexer configured to couple the first data register and the first memory column; and a second multiplexer configured to couple the second data register and the first memory column.

Clause 17.

The system of clause 15, wherein the second logic block comprises a second memory column, wherein the second memory column is coupled to the first data register and the second data register.

Clause 18.

The system of clause 17, wherein the second memory column is configurable to sample data from the first data register and the second data register for the plurality of clock cycles.

Clause 19.

The system of clause 17, wherein the plurality of clock cycles comprises at least sixteen clock cycles.

Clause 20.

A method comprising:
sampling first data from a first register of programmable logic circuitry, the first data sampled for a plurality of clock cycles at a clock speed of the programmable logic circuitry; and storing the first data at a memory column of the programmable logic circuitry, wherein the memory column is configurable to operate as a First In, First Out (FIFO) in a first mode, configurable to operate as user lookup table (LUT) in a second mode, and configurable to operate as user random access memory (RAM) in a third mode.

What is claimed is:

1. An integrated circuit, comprising:
a first logic block, the first logic block comprising a data register configurable to store data; and
a second logic block, the second logic block comprising a memory column coupled to the data register, wherein the memory column is configurable to operate as a First In, First Out (FIFO) to sample data from the data register for a plurality of clock cycles and at a speed of a clock of the integrated circuit.

2. The integrated circuit of claim 1, comprising an interconnect region disposed between the first logic block and the second logic block.

3. The integrated circuit of claim 2, wherein the interconnect region is configurable to couple the data register to the memory column.

4. The integrated circuit of claim 2, wherein the interconnect region comprises a multiplexer configured to couple the data register to the memory column.

5. The integrated circuit of claim 1, wherein the second logic block comprises a second memory column, wherein the second memory column is configurable to operate as a second FIFO to sample data from the data register for the plurality of clock cycles and at the speed of the clock.

6. The integrated circuit of claim 1, wherein the first logic block comprises a second data register coupled to the memory column, wherein the memory column is configurable to operate as the FIFO to sample data from the data register and the second data register for the plurality of clock cycles.

7. The integrated circuit of claim 1, comprising:
the first logic block comprising a second data register; and
the second logic block comprising a second memory column coupled to the second data register, wherein the second memory column is configurable to operate as a second FIFO to sample data from the second data register for the plurality of clock cycles.

8. The integrated circuit of claim 7, wherein the second memory column is configurable to operate as user lookup table (LUT) mode or user random access memory (RAM) when not configured as the second FIFO.

9. The integrated circuit of claim 1, wherein the memory column comprises at least thirty-two memory cells.

10. The integrated circuit of claim 9, wherein the memory column is configurable to store data from the data register in at least sixteen memory cells.

11. The integrated circuit of claim 10, wherein the data from the data register is from at least sixteen continuous clock cycles.

12. The integrated circuit of claim 9, wherein the second logic block comprises a second memory column, wherein the second memory column comprises at least thirty-two memory cells.

13. The integrated circuit of claim 12, wherein the memory column and the second memory column are configurable to store data from the data register from at least sixty-four continuous clock cycles.

14. The integrated circuit of claim 9, wherein the memory column is configurable to store data from the data register from thirty-two continuous clock cycles.

15. A system comprising:
programmable logic circuitry comprising a plurality of configuration memory, the programmable logic circuitry comprising:
a first logic block comprising a first data register and a second data register; and
a second logic block comprising a first memory column, wherein the first memory column is coupled to the first data register and the second data register, and wherein the first memory column is configurable to sample data from the first data register and the second data register for a plurality of clock cycles.

16. The system of claim 15, wherein the programmable logic circuitry comprises:
a first multiplexer configured to couple the first data register and the first memory column; and
a second multiplexer configured to couple the second data register and the first memory column.

17. The system of claim 15, wherein the second logic block comprises a second memory column, wherein the second memory column is coupled to the first data register and the second data register.

18. The system of claim 17, wherein the second memory column is configurable to sample data from the first data register and the second data register for the plurality of clock cycles.

19. The system of claim 17, wherein the plurality of clock cycles comprises at least sixteen clock cycles.

20. A method comprising:
sampling first data from a first register of programmable logic circuitry, the first data sampled for a plurality of clock cycles at a clock speed of the programmable logic circuitry; and storing the first data at a memory column of the programmable logic circuitry, wherein the memory column is configurable to operate as a First In, First Out (FIFO) in a first mode, configurable to operate as user lookup table (LUT) in a second mode, and configurable to operate as user random access memory (RAM) in a third mode.

* * * * *